US005652762A

United States Patent [19]
Otsuka et al.

[11] Patent Number: 5,652,762
[45] Date of Patent: Jul. 29, 1997

[54] SEMICONDUCTOR LASER DEVICE AND METHOD FOR FABRICATING THE SAME AND STRAINED QUANTUM WELL CRYSTAL AND METHOD FOR FABRICATING THE SAME

[75] Inventors: Nobuyuki Otsuka, Kawanishi; Masahiro Kito, Toyonaka; Masato Ishino, Shijyonawate; Yasushi Matsui, Neyagawa, all of Japan

[73] Assignee: Matsushita Electric Industrial Co., Ltd., Osaka, Japan

[21] Appl. No.: 520,021

[22] Filed: Aug. 28, 1995

[30] Foreign Application Priority Data

Aug. 29, 1994 [JP] Japan .................... 6-203844

[51] Int. Cl.[6] ............................ H01S 3/19; H01L 29/06
[52] U.S. Cl. ................................. 372/45; 257/14
[58] Field of Search .................. 372/45; 257/14, 257/15, 17, 22

[56] References Cited

U.S. PATENT DOCUMENTS 5,408,487  4/1995  Uchida et al. ..................... 372/45

OTHER PUBLICATIONS

T. Tanbun-Ek et al., "High power output 1.48–1.51 µm continuously graded index separate confinement strained quantum well lasers", Appl. Phys. Lett., vol. 57, No. 3, pp. 224–226, 1990, Jul.

T. Namegaya et al., "Effects of Well Number in 1.3-µm GaInAsP/InP Grin-Sch Strained-Layer Quantum-Well Lasers", IEEE Journal of Quantum Electronics, vol. 30, No. 2, pp. 578–584, 1994, Feb.

T. Takiguchi et al., "Improvement of crystal quality and laser characteristics by zero net strain structure", Journal of Crystal Growth, vol. 145, pp. 892–897, 1994 (No month).

M.A. Shahid et al., "Atomic Ordering in $Ga_{0.47}In_{0.53}As$ and $Ga_xIn_{1-x}As_yP_{1-y}$ Alloy Semiconductors", Physical Review Letters, vol. 58, No. 24, pp. 2567–2570, 1987 Jun.

S.N.G. Chu et al., "Atomic ordering in InGaAsP and InGaAs grown by atmospheric pressure metalorganic chemical vapor deposition", J. Appl. Phys., vol. 72, No. 9, pp. 4118–4124, 1992, Nov.

D.J. Arent et al., "Band-gap narrowing in ordered $Ga_{0.47}In_{0.53}As$", Appl. Phys. Lett., vol. 62, No. 12, pp. 1806–1808, 1993 (No month).

T. Tsuchiya et al., "Investigation of effect of strain on low-threshold 1.3µm InGaAsP strained-layer quantum well lasers", Electronics Letters, vol. 30, No. 10, p. 788 (May 12, 1994).

N. Chand et al., "$(InAs)_1/(GaAs)_4$ Superlattice strained Quantum Well Laser at 980 nm", vol. 27, No. 22, pp. 2009–2011, (Oct. 24, 1991).

G. Forstmann et al, "Effects of strain and $GaInP_2$ superlattice ordering on laser polarization", Semicoductor Science and Technology, vol. 9, No. 6, pp. 1268–1271 (1994), Jun.

W. Richter et al., "Metalorganic Vapor Phase Epitaxy 1990", Journal of Crystal Growth, vol. 107, No. 1/04, pp. 724–730, (Jan. 1, 1991).

W. Plano et al., "Column III and V ordering in InGaAsP and GaAsP grown on GaAs by metalorganic chemical vapor deposition", Applied Physics Letters, vol. 53, No. 25, pp. 2537–2539, (Dec. 19, 1988).

M. Ichimura et al., "Short-range order in III-V ternary alloy semiconductors", J. Appl. Phys., vol. 60, No. 11, pp. 3850–3855, (Dec. 1, 1986).

F. Srobar, "Free Enthalpy of Ternary Alloy Superlattice", Crystal Res. & Technol., vol. 17, No. 8, pp. 943–949, (1982) (No month).

European Search Report Dated Feb. 1, 1996.

*Primary Examiner*—James W. Davie
*Attorney, Agent, or Firm*—Ratner & Prestia

[57] ABSTRACT

The semiconductor laser device of the invention includes: a strained quantum well structure including a well layer and a barrier layer, and a semiconductor substrate for supporting the strained quantum well structure. In the semiconductor laser device, at least one of the well layer and the barrier layer is composed of a mixed crystal where an atomic ordering is generated.

4 Claims, 12 Drawing Sheets

FIG. 1A Atomic ordering not generated
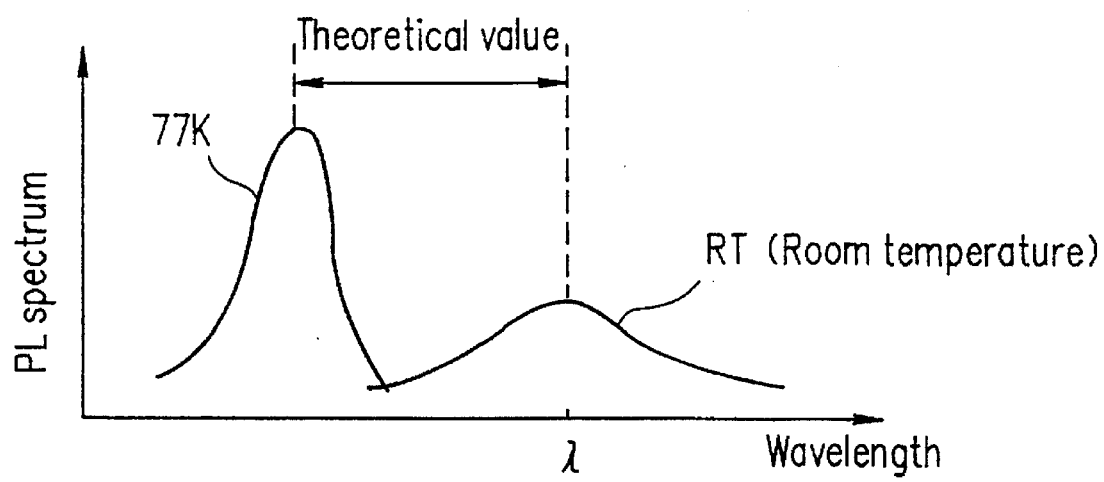
FIG. 1B Atomic ordering generated
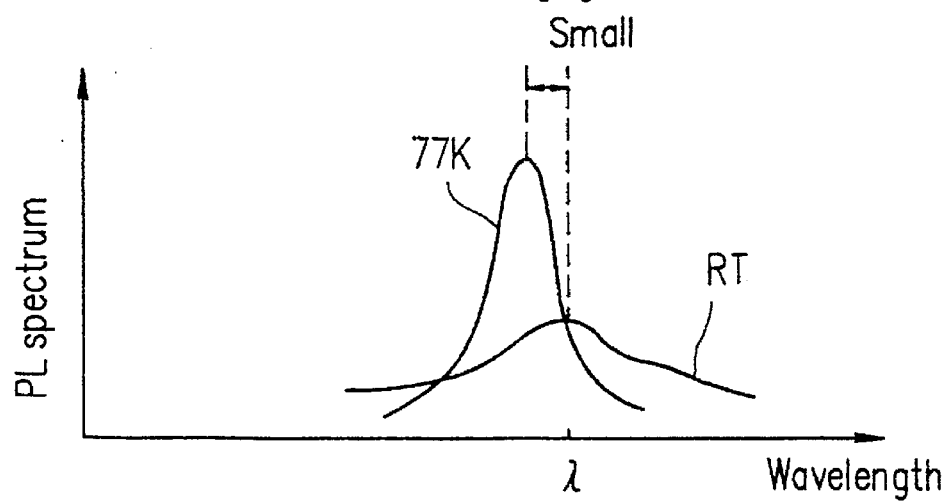

FIG. 3A  Atomic ordering not generated
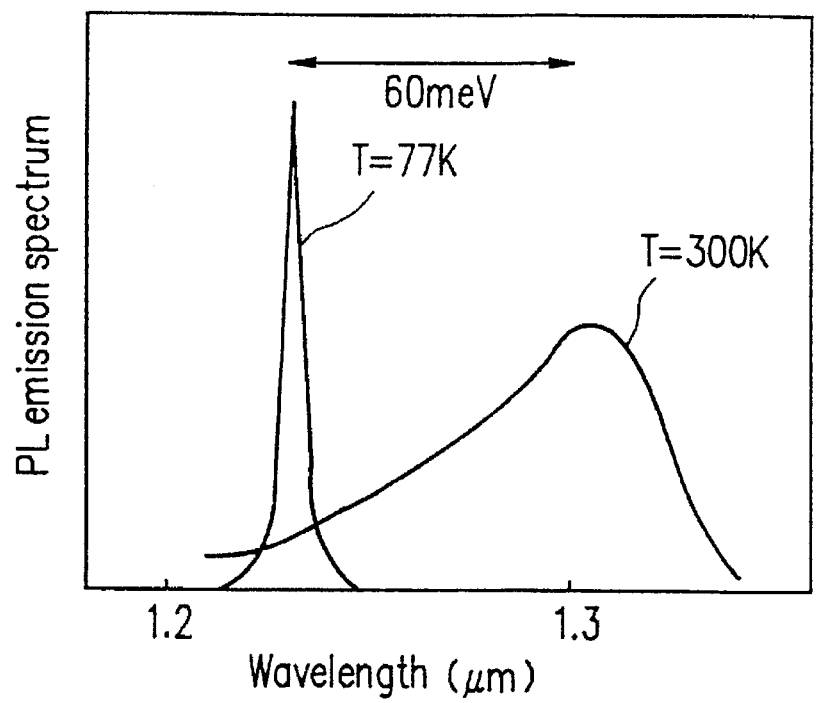
FIG. 3B  Atomic ordering generated
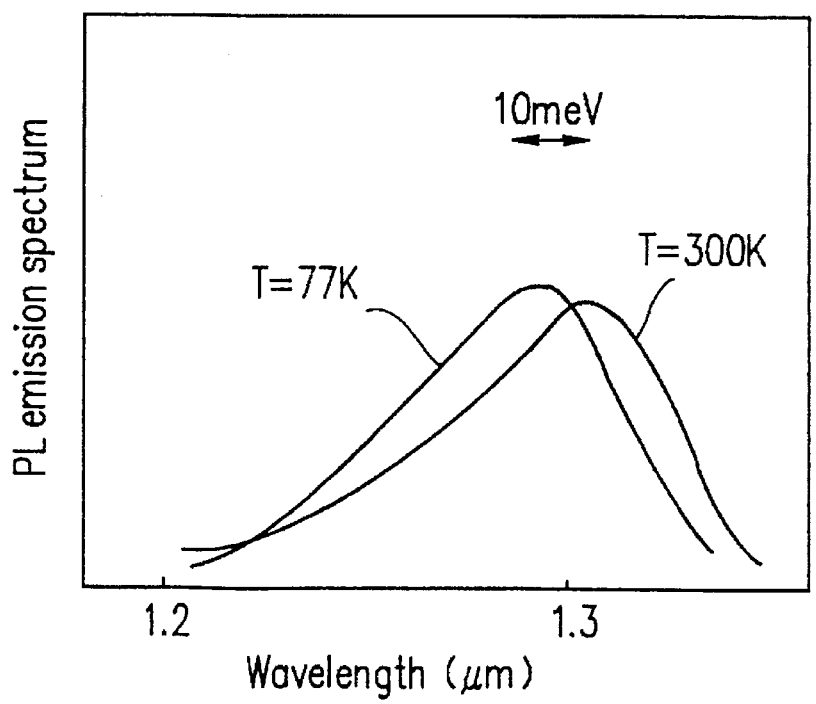

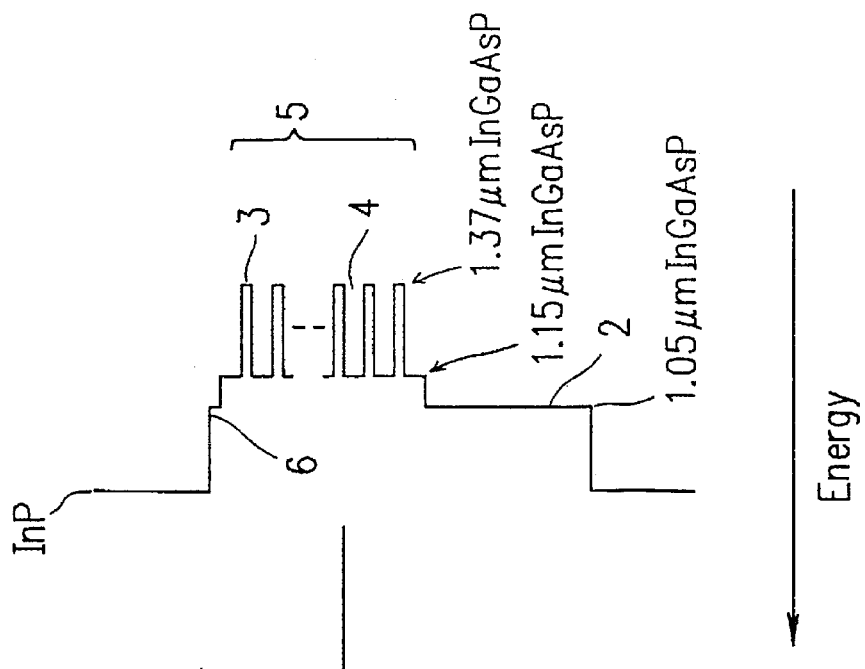
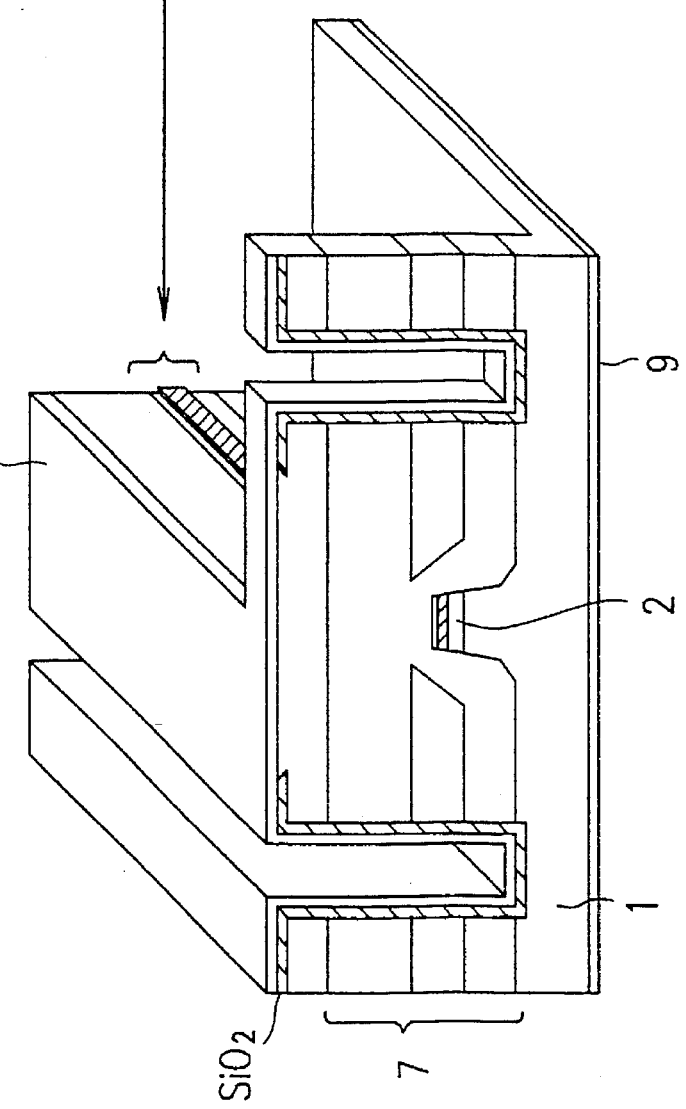
FIG. 7A
FIG. 7B

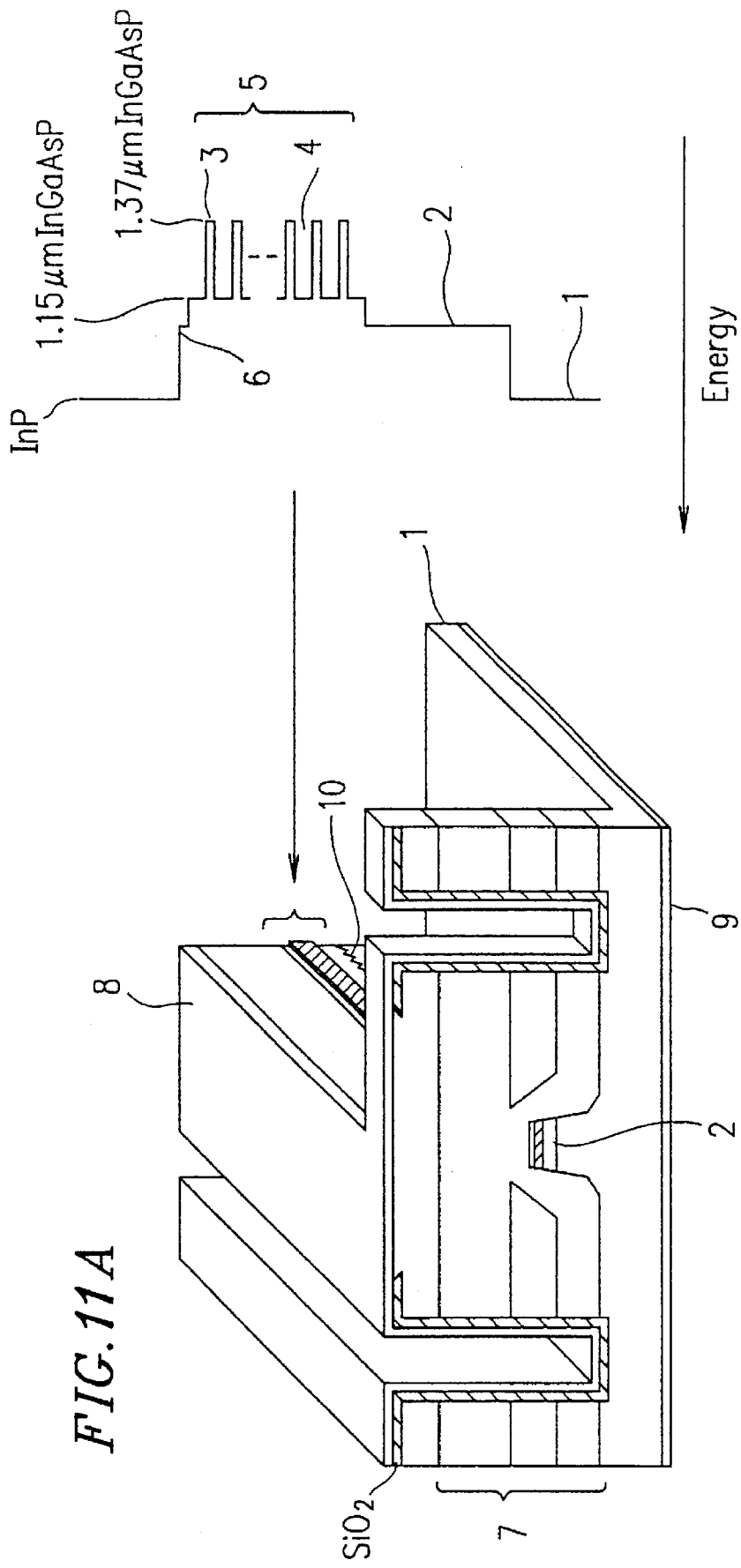

Non-strained MQW: Wide gain profile

Strained MQW: Abrupt gain profile

SEMICONDUCTOR LASER DEVICE AND METHOD FOR FABRICATING THE SAME AND STRAINED QUANTUM WELL CRYSTAL AND METHOD FOR FABRICATING THE SAME

BACKGROUND OF THE INVENTION

1. Field of the Invention

The present invention relates to a semiconductor laser device and a method for fabricating the same, and a strained quantum well crystal and a method for fabricating the same.

2. Description of the Related Art

Referring to FIGS. 15A and 15B, a conventional strained quantum well type semiconductor laser device will be described. Such a strained quantum well type semiconductor laser device is disclosed, for example, in Temkin et al., J. Cryst. Growth, 93, 353, (1988).

As shown in FIG. 15B, the semiconductor laser device includes: an InP single crystalline substrate 1; a stripe-shaped multi-layered structure 10 provided on the substrate 1; and Fe-InP current blocking layers 7 for covering both sides of the multi-layered structure. An n-type electrode 9 is provided on the bottom surface of the semiconductor laser device and a p-type electrode 8 is provided on the upper surface of the semiconductor laser device. A dielectric film containing $SiO_2$ and/or Si is provided on an end surface of the semiconductor laser device.

The stripe-shaped multi-layered structure 10 includes: a first optical waveguide layer 2; a multi-quantum well portion 5 consisting of a strained quantum well layer 3 and a barrier layer 4; and a second optical waveguide layer 6. The energy band gaps in this portion are shown in FIG. 15A.

When a current is supplied from the p-type electrode 8 to the n-type electrode 9, holes and electrons are confined in the multi-quantum well portion 5, so that the holes and the electrons are recombined so as to generate an optical emission. As a result, a laser oscillation is generated in the semiconductor laser device. In this conventional example, the strained quantum well layer 3 is composed of mixed crystals having a composition of $In_{0.7}Ga_{0.3}As$, and is formed so as to have a compression strain of 1%. By introducing the compression strain into the well layer 3, the band structure of the holes can be similar to the band structure of the electrons. As a result, even if a small amount of carriers are injected, the laser oscillation is generated in the semiconductor laser device.

However, in such a semiconductor laser device, as the temperature of the semiconductor laser device increases, the wavelength of the laser oscillation is shifted to the longer wavelength side. Therefore, such a semiconductor laser device has a problem in that the oscillation wavelength thereof is variable in accordance with the variation of the temperature of the semiconductor laser device.

In addition, if the amount of the current to be injected into the semiconductor laser device is increased, the temperature of the semiconductor laser device is also increased; consequently the wavelength of the laser oscillation is considerably varied depending upon the amount of the injected current.

On the other hand, in the case where such a strained quantum well structure is applied to a distributed feedback type laser device (hereinafter, simply referred to as a "DFB type laser device"), the variation in the temperature of the semiconductor laser device makes it difficult to realize a single mode oscillation. In other words, a side mode is generated in the semiconductor laser device, and the difference between the peak at the oscillation wavelength and the peak of the side mode cannot be set to be large. Such a phenomenon is remarkable in a strained quantum well laser device, in particular, because the introduction of the strain to the laser device reduces the threshold carrier density and causes an abrupt gain for the laser device.

FIG. 12A shows the profiles of the gain spectra varying depending upon the temperature in a semiconductor laser device having a non-strained multiple-quantum well (MQW) structure, while FIG. 12B shows the profiles of the gain spectra varying depending upon the temperature in a semiconductor laser device having a strained MQW structure.

As shown in FIG. 12A, since the gain is not so large in the laser device having the non-strained MQW structure, substantially flat gain spectrum can be obtained in a wide wavelength region. The wavelength at the peak of this gain spectrum is shifted to a longer wavelength side as the temperature (T) of the laser device is set to be higher (high T). However, since the gain spectrum is flat in the laser device having the non-strained MQW structure, the difference between the peak at the oscillation wavelength and the peak of the side mode can be set to be large. In other words, it is easier to realize the single mode oscillation for the laser device. The reason is as follows. Even when the variation of the temperature makes longer the distance between the wavelength at the peak of the gain spectrum and the DFB oscillation wavelength, the gain can still be obtained at the DFB oscillation wavelength, so that the laser device can preferentially oscillate at the DFB oscillation wavelength.

On the other hand, in the case where the laser device has a strained MQW structure, the introduction of the strain locally increases the gain in a particular wavelength region, as shown in FIG. 12B. If the ambient temperature is low (low T), the DFB oscillation can still be generated even when the wavelength at the peak of the gain spectrum deviates from the DFB oscillation wavelength to a certain degree. As a result, the difference between the peak at the oscillation wavelength and the peak of the side mode can be set to be large.

However, if the temperature becomes high (high T), the wavelength at the peak of the gain spectrum is shifted to the longer wavelength side in the same way as in the laser device having the non-strained MQW structure, so that substantially no gain can be obtained at the DFB oscillation wavelength. As a result, not only the decrease in the gain at the DFB oscillation wavelength but also the laser oscillation at the wavelength at the peak of the gain spectrum are caused. Consequently, the difference between the peak at the oscillation wavelength and the peak of the side mode cannot be set to be large and it becomes difficult to realize a single mode oscillation for the laser device. That is to say, since the strained quantum well laser device, in particular, has an abrupt gain profile, even when the distance between the DFB oscillation wavelength and the wavelength at the peak of the gain spectrum is short, i.e., the amount of the detuning to be performed is small, the difference between the peak at the oscillation wavelength and the peak of the side mode becomes disadvantageously small and it becomes difficult to realize the single mode oscillation. Therefore, even if a smaller amount of the detuning is required for a strained quantum well laser device as compared with a non-strained quantum well laser device, the single mode oscillation cannot be realized easily. Accordingly, a semiconductor laser device with a small degree of the temperature dependence of a gain wavelength is desired.

SUMMARY OF THE INVENTION

The semiconductor laser device of the invention includes: a strained quantum well structure including a well layer and a barrier layer, and a semiconductor substrate for supporting the strained quantum well structure. In the semiconductor laser device, at least one of the well layer and the barrier layer is composed of a mixed crystal where an atomic ordering is generated.

In one embodiment, the semiconductor laser device further includes a first optical waveguide layer and a second optical waveguide layer so as to sandwich the strained quantum well structure therebetween.

In another embodiment, the semiconductor substrate is composed of InP, and the well layer and the barrier layer are composed of an InGaAsP crystal having respectively different energy band gaps.

According to another aspect of the present invention, a method for fabricating a semiconductor laser device including a strained quantum well structure including a well layer and a barrier layer is provided. In this method, a process for forming the strained quantum well structure includes a process step for forming at least one of the well layer and the barrier layer by using a mixed crystal where an atomic ordering is generated.

In one embodiment, the process step for forming the well layer includes the steps of: introducing a lattice strain in an amount expressed by an equation: strain amount (%)=1.0–0.10×(a number of the well layers), or more; and growing the well layer at a temperature of 580° C. or lower.

In another embodiment, the process step for forming the well layer includes the steps of: introducing a lattice strain in an amount expressed by an equation: strain amount (%)=1.2–0.02×(a number of the well layers), or more; and growing the well layer at a temperature of 600° C. or lower.

In still another embodiment, the process step for forming the well layer includes the steps of: introducing a lattice strain in an amount expressed by an equation: strain amount (%)=1.6–0.02×(a number of the well layers), or more; and growing the well layer at a temperature of 700° C. or lower.

According to still another aspect of the present invention, a strained quantum well crystal including: a semiconductor crystal; and an InGaAsP crystal having a lattice constant different from a lattice constant of the semiconductor crystal, is provided. In the strained quantum well crystal, an atomic ordering is generated in the InGaAsP crystal.

According to still another aspect of the present invention, a method for fabricating a strained quantum well crystal including a semiconductor crystal and an InGaAsP crystal having a lattice constant different from a lattice constant of the semiconductor crystal, is provided. In this method, a process step for forming a well layer includes the steps of: introducing a strain in an amount of 1% or more into the well layer, and growing the well layer at a temperature of 620° C. or higher.

Thus, the invention described herein makes possible the advantages of providing: (1) a semiconductor laser device where the temperature dependence and the injection current dependence of the oscillation wavelength is small, and a single mode oscillation is realized in a wide temperature range and a wide current injection range and a method for fabricating the same; and (2) providing a semiconductor crystal used for such a semiconductor laser device and a method for fabricating the same.

These and other advantages of the present invention will become apparent to those skilled in the art upon reading and understanding the following detailed description with reference to the accompanying figures.

BRIEF DESCRIPTION OF THE DRAWINGS

FIG. 1A is a graph showing the temperature dependence of a PL emission spectrum to be shifted from a peak wavelength at 77K to a peak wavelength at room temperature in the case where an atomic ordering is not generated.

FIG. 1B is a graph showing the temperature dependence of a PL emission spectrum to be shifted from a peak wavelength at 77K to a peak wavelength at room temperature in the case where an atomic ordering is generated.

FIG. 2A is a cross-sectional view showing a strained quantum well crystal structure according to a first example of the present invention, while

FIGS. 3A and 3B are graphs illustrating a difference in the PL emission spectra depending upon the generation of the atomic ordering.

FIG. 7A is a cross-sectional view showing a strained quantum well semiconductor laser device according to a second example of the present invention, while FIG. 7B is an energy band diagram of the strained quantum well structure of the second example.

FIG. 11A is a cross-sectional view showing a strained quantum well semiconductor laser device according to a third example of the present invention, while FIG. 11B is an energy band diagram of the strained quantum well structure of the third example.

FIG. 15A is an energy band diagram of the strained quantum well structure of the conventional semiconductor laser device, while

DESCRIPTION OF THE PREFERRED EMBODIMENTS

Figure 2A:
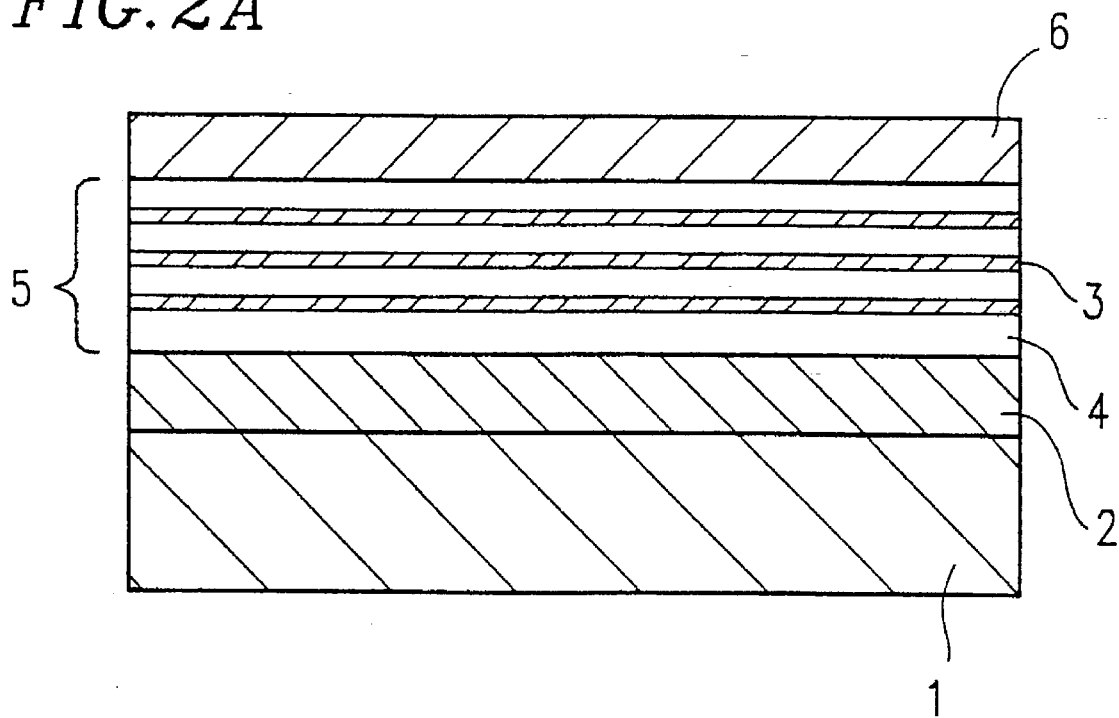

According to the present invention, by introducing an atomic ordering into at least one of a well layer and a barrier layer, it is possible to provide a strained quantum well crystal suitable for a light-emitting element such as a semiconductor laser device where the wavelength at the peak of the gain spectrum has a small temperature dependence.

In general, in the case of producing a mixed crystal composed of a diatomic compound represented by AC and a diatomic compound represented by BC, a mixed crystal represented by $(AB)C_2$ where the atoms A and B are uniformly mixed can be obtained. However, in the case where such a mixed crystal is formed at a low temperature, a mixed crystal where the atoms A and B are not mixed uniformly and the compounds AC and BC are arranged in a multi-layer manner is sometimes obtained. As a result, observed is a superlattice structure where the lattice planes of the compounds AC and the lattice planes of the compounds BC are alternately arranged is observed. In addition, when a crystal is grown at a low temperature, a superlattice is automatically formed. For the purpose of distinction, this type of superlattice is called a "natural superlattice", as opposed to an "artificial superlattice" such as a quantum well structure. In this specification, if such a natural superlattice is formed, then an expression "a structure has an atomic ordering" or "an atomic ordering is generated in a structure" will be used even when such a superlattice is only partially formed.

Hereinafter, the present invention will be described as being applied to an InGaAsP crystal. In the InGaAsP crystal grown at a temperature of 620° C. or higher, the atomic ordering is not generated when the well is not strained. According to the experimental results obtained by the present inventors with respect to this crystal while varying the amount of the strain, the number of the well layers, and the crystal growth temperature, the atomic ordering is generated under certain conditions.

More specifically, the present inventors have found that the atomic ordering is likely to be generated under the following conditions: (1) the amount of the strain in the InGaAsP crystal is large; (2) the number of the well layers is large; and (3) the crystal growth temperature is low. Although it was found that the atomic ordering is likely to be generated under any of the conditions (1) to (3), the present inventors thought at first that some dislocations were introduced into the crystal. However, the observation of the crystal using a transmission electron microscope revealed that no dislocation existed in the crystal, but that the atomic ordering was generated in the InGaAsP crystal. The temperature dependence of the PL emission spectrum of this crystal is shown in FIG. 1B. As shown in FIG. 1B, the difference between the wavelength at the peak of the PL emission spectrum at room temperature (RT) and the wavelength at the peak of 77K has been found to be small. In the case where the atomic ordering is not generated, the difference between the wavelength at the peak of the PL emission spectrum at room temperature and the wavelength at the peak of 77K is large as shown in FIG. 1A. Conventionally, based on the results shown in FIG. 1B, it has been considered that the degradation of the PL characteristics of a strained quantum well structure is caused by the generation of the atomic ordering. However, the present inventors have found that a semiconductor laser device where the oscillation wavelength is varied a little depending upon the temperature and the injection current can be provided by positively utilizing the atomic ordering phenomenon.

Hereinafter, the present invention will be described by way of illustrative examples using the InGaAsP crystal with reference to accompanying drawings.

Example 1

Figure 2B:
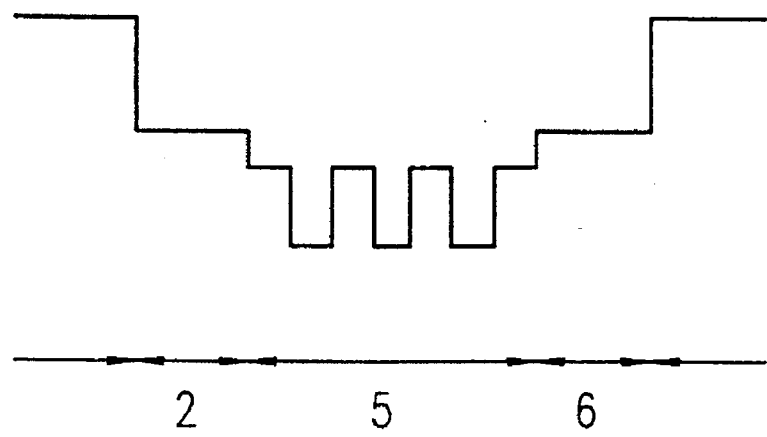
FIG. 2B is an energy band diagram of the strained quantum well crystal structure of the first example.

Referring to FIGS. 2A and 2B, an exemplary strained quantum well crystal according to the present invention will be described.

FIG. 2A is a cross-sectional view schematically showing a strained quantum well crystal including an Sn-doped InP semiconductor single crystalline substrate 1, and a multi-layered structure provided on the Sn-doped InP semiconductor single crystalline substrate 1. This multi-layered structure is obtained by epitaxially growing an InGaAsP ($\lambda g=1.05$ μm) first optical waveguide layer 2; a multiple-quantum well structure 5; and an InGaAsP ($\lambda g=1.05$ μm) second optical waveguide layer 6, in this order on the InP semiconductor single crystalline substrate 1. The multiple-quantum well structure 5 includes InGaAsP strained well layers 3 (compression strain of 0.8%) and InGaAsP ($\lambda g=1.15$ μm) barrier layers 4 which are alternately deposited so as to form seven quantum wells. The atomic ordering is generated in the multiple-quantum well structure 5. The photoluminescence (PL) emission wavelength of the multiple-quantum well structure 5 is 1.3 μm. In this example, a compression strain of 0.8% is introduced into the strained well layers 3 and the crystal growth temperature is set to be 580 degrees, so that the atomic ordering is generated in the barrier layers 4. The energy band gap of the multi-layered structure is shown in FIG. 2B.

The present inventors have confirmed that the atomic ordering exists in the barrier layers 4 by a transmission electron microscopy. However, it is possible that the atomic ordering is also generated in quantum well layers 3. In this example, since the compression strain is introduced into the quantum well layers 3, a tensile strain is generated in the barrier layers 4. Therefore, the atomic ordering is more likely to be generated by the tensile strain. In order to generate the atomic ordering preferentially within the quantum well layers 3, it seems to be preferable that the tensile strain is generated in the well layers by adjusting the composition of the well layers.

The PL emission spectra of the strained quantum well crystal are measured. FIG. 3A shows the PL emission peaks of the strained quantum well crystal having no atomic ordering, while FIG. 3B shows the PL emission peaks of the strained quantum well crystal having an atomic ordering. In the case where no atomic ordering is generated, by lowering the temperature from room temperature (T=300K) to 77K, a short wavelength shift of 60 meV is generated. On the other hand, in the case where an atomic ordering is generated, the short wavelength shift is a negligible one, e.g., 10 meV. In addition, if the temperature is maintained at room temperature, then the emission spectrum is not reduced irrespective of the generation of the atomic ordering. Consequently, the strained quantum well crystal having an atomic ordering exhibits an emission characteristic having a low temperature dependence.

Figure 4:
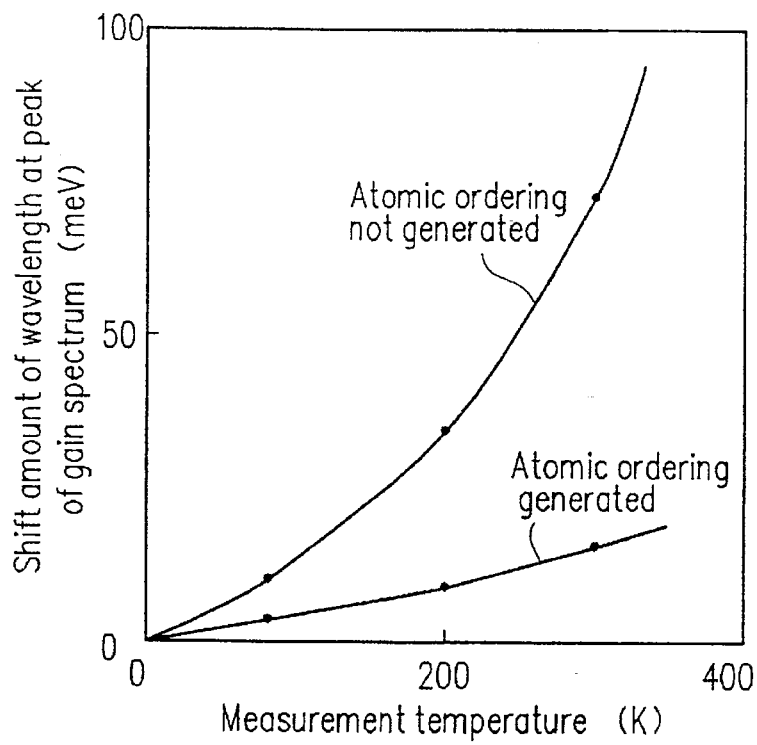
FIG. 4 is a graph illustrating a difference in a shift amount of the wavelength at a peak of the gain spectrum depending upon the generation of the atomic ordering.

FIG. 4 shows the temperature dependence of the PL emission peak wavelength. In the case where the atomic ordering is generated, the temperature dependence of the PL emission peak wavelength is reduced to one fifth or less of the dependence in the case where no atomic ordering is generated, as shown in FIG. 4.

The present inventors analyze the reasons why the atomic ordering is more likely to occur by giving a strain to the crystal and lowering the crystal growth temperature T in the following manner.

For example, in the case where a compression strain is introduced into the InGaAsP strained quantum well layer, the internal energy of the crystal is increased by an amount corresponding to the energy of the strain. However, if In-As bonds having a large lattice constant are naturally oriented in the crystal growth direction so as to generate the atomic ordering, then the strain energy of the strained quantum well layer is reduced.

An internal energy U of a crystal is generally expressed by the following equation:

$$U = H - TS$$

where H is an enthalpy, T is a temperature and S is an entropy (S<0). The smaller the internal energy U becomes, the stabler the crystal becomes. Since the introduction of the strain into the crystal increases the enthalpy H, the crystal tends to reduce the internal energy U thereof by reducing the entropy S. In other words, it is necessary that the enthalpy H is increased and the entropy S is reduced by introducing a large strain into the quantum well.

On the other hand, the relationship between the crystal growth temperature and the atomic ordering is presumed to be as follows. Since U and H vary in proportion to a square of T, the decrease in the crystal growth temperature T causes the decrease in S in proportion to T. As a result, the decrease in S, i.e., the atomic ordering, is likely to be generated.

In addition, the present inventors analyze the reasons why the generation of the atomic ordering suppresses the temperature dependence in the following manner. If the generation of the atomic ordering reduces the entropy S, then the temperature dependence of the internal energy U is suppressed. Since the energy band gap Eg determining the oscillation wavelength is variable depending upon the internal energy U, it is possible to suppress the variation of the energy band gap Eg depending upon the temperature by suppressing the temperature dependence of the internal energy U. Consequently, the generation of the atomic ordering can suppress the variation of the wavelength depending upon the temperature.

Figure 5:
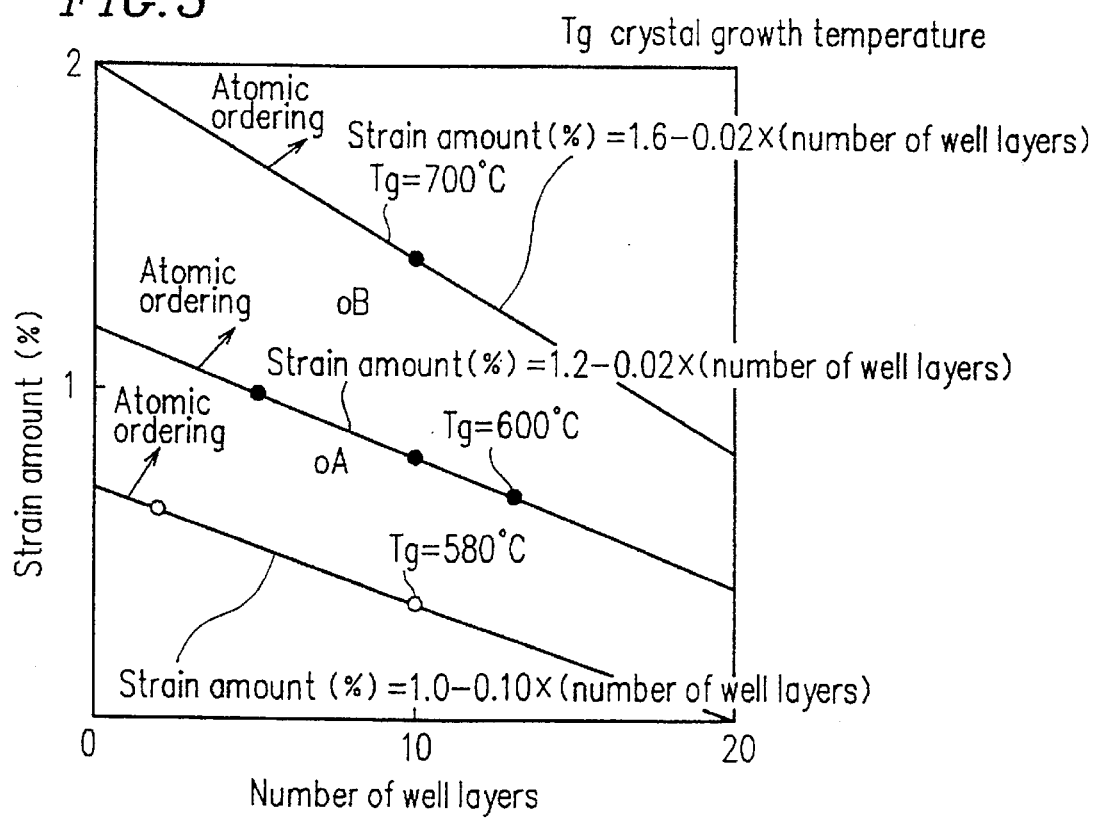
FIG. 5 is a graph showing the relationship between the number of the well layers and the amount of the lattice strain to be varied depending upon a crystal growth temperature as a parameter and the generation of the atomic ordering.

FIG. 5 is a graph showing the relationship between the amount of the strain and the number of the quantum well layers for generating the atomic ordering at the respective crystal growth temperatures Tg of 580°, 600° and 700° C. As shown in FIG. 5, if the amount of the strain and the number of the well layers are set to be large, then the atomic ordering is more likely to be generated. Based on the results obtained in this experiment, when the crystal growth temperature Tg is 580° C., the strain amount $_{580}$ where the atomic ordering is generated can be expressed by following Equation 1 using the number of the well layers:

strain amount $_{580}$ (%)=1.0−0.10×the number of the well layers  (1)

That is to say, if a strain in an amount larger than the strain amount $_{580}$ obtained by Equation 1 is introduced, then the atomic ordering is generated. On the other hand, if a strain in an amount smaller than the strain amount $_{580}$ obtained by Equation 1 is introduced, then the atomic ordering is not generated.

As shown in FIG. 5, the higher the crystal growth temperature Tg is set to be, the lower the possibility of the generation of the atomic ordering becomes. Therefore, even when the crystal growth temperature Tg is lower than 580° C., the atomic ordering is possibly generated in the region expressed by the inequality "strain amount (%)≧1.0−0.10× the number of the well layers".

In the same way, when the crystal growth temperatures Tg are 600° C. and 700° C., then the atomic ordering is generated in the regions expressed by the following Equations 2 and 3, respectively:

strain amount (%)≧1.2−0.02× the number of the well layers (when Tg is 600° C.)  (2)

strain amount (%)≧1.6−0.02×the number of the well layers (when Tg is 700° C.)  (3)

During an actual fabrication of a semiconductor laser device, the crystal growth is frequently performed at a temperature of 600° C. or higher. In addition, an optimal number of well layers for preventing the decrease in the optical output from a semiconductor laser device is required to be 10 or less. Accordingly, in order to generate an atomic ordering in the case where the crystal growth is performed at a temperature of about 600° C., it is necessary to form a compression strain of about 1%. On the other hand, in the case where the crystal growth temperature is lowered to 580° C. and the number of the well layers is set to be seven, the atomic ordering can be generated by giving a compression strain of about 0.7%.

It is noted that the strain amount can be controlled by adjusting the composition of the crystal to be grown so as to grow a crystal with a desired lattice constant.

A strained quantum well crystal structure according to the present invention is suitably applied to an emission region of a semiconductor laser device usable for a pump light source of a fiber amplifier, in particular. In order to obtain a sufficient amount of gain by a fiber amplifier, a laser beam at a particular wavelength is required to be used. However, in the case where a large driving current of 500 mA or more is applied to a semiconductor laser device, the modulation of the driving current considerably varies the radiation amount of the heat from the semiconductor laser device, so that the wavelength of the laser oscillation is adversely varied. However, in the semiconductor laser device of the present invention, the oscillation wavelength is varied little depending upon the temperature. Therefore, even if the driving current is increased, the oscillation wavelength can be easily maintained within a predetermined range required for a fiber amplifier.

Furthermore, even when the width of the active layer in a semiconductor laser device is varied in respective elements and the radiation amount of the heat with respect to the same amount of the driving current (or the injection current) differs in the respective laser devices, the oscillation wavelength is maintained to be constant. Therefore, according to the present invention, it is possible to considerably increase the production yield of a semiconductor laser device satisfying a desired design rule.

Figure 6:
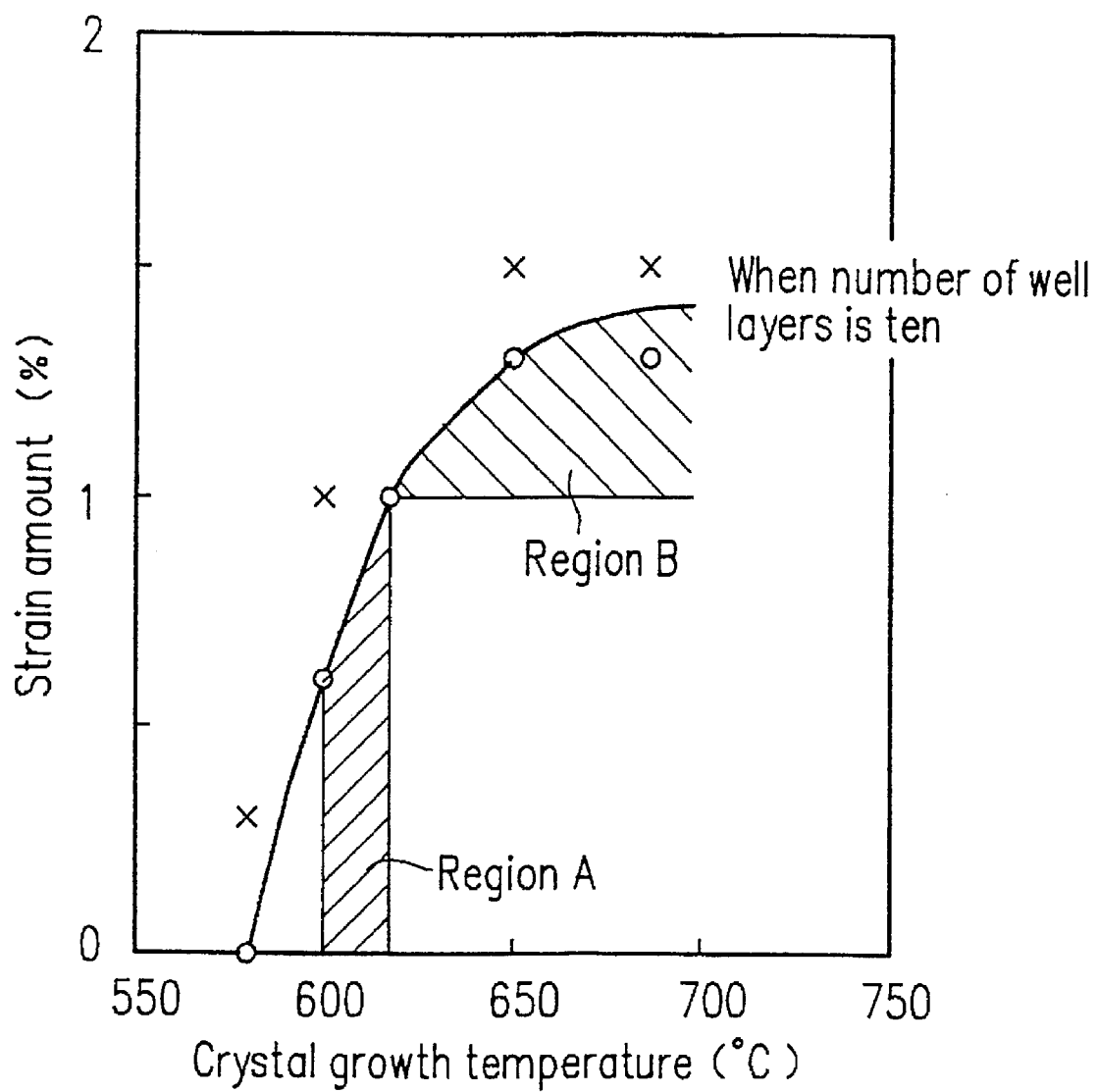
FIG. 6 is a graph showing the relationship between the strain amount (%) where the atomic ordering is generated and the crystal growth temperature (°C.) when the number of the InGaAsP strained quantum well layers is ten.

FIG. 6 is a graph showing the relationship between the strain amount (%) required for generating the atomic ordering and the crystal growth temperature (°C.) when the number of the InGaAsP strained quantum well layers is set to be ten. The atomic ordering is generated in the region having a strain larger than the strain indicated by the curve shown in FIG. 6. The InGaAsP strained quantum well layer is generally grown at a temperature in an approximate range of 600° to 620° C. Accordingly, in order to prevent the generation of the atomic ordering, the crystal growth is required to be performed in the region A. On the other hand, in the case where the InGaAsP strained quantum well layer is grown at a temperature of 620° C. or higher, the generation of the atomic ordering can be prevented by employing the conditions indicated by the region B shown in FIG. 6.

An objective of the present invention is to provide a strained quantum well crystal having an emission characteristic which is less likely to be varied depending upon the temperature by intentionally causing the atomic ordering. However, in the course of defining the conditions for generating the atomic ordering, the contrary conditions, i.e., the conditions for preventing the generation of the atomic ordering are also clarified. In order to realize the PL characteristic shown in FIG. 1A while supplying a large strain to the quantum well layer, the crystal growth is required to be performed under the conditions indicated by the region B shown in FIG. 6.

Example 2

Referring to FIGS. 7A and 7B, another exemplary strained quantum well semiconductor laser device according to the present invention will be described. FIG. 7A schematically shows a structure of a semiconductor laser device including an Sn-doped InP semiconductor single crystalline substrate 1 having a stripe-shaped ridge (width: 1.2 to 1.5 µm; height: 1.5 to 2.5 µm), and a stripe-shaped multi-layered structure provided on the ridge of the Sn-doped InP semiconductor single crystalline substrate 1. This stripe-shaped multi-layered structure is obtained by epitaxially growing an InGaAsP ($\lambda g=1.05$ µm) first optical waveguide layer 2; a multiple-quantum well structure 5; and an InGaAsP ($\lambda g=1.05$ µm) second optical waveguide layer 6, in this order on the InP semiconductor single crystalline substrate 1. The thickness of the first optical waveguide layer 2 and that of the second optical waveguide layer 6 are set to be 30 nm and 150 nm, respectively.

The multiple-quantum well structure 5 includes InGaAsP strained well layers 3 (compression strain of 0.8%) and InGaAsP ($\lambda g=1.15$ µm) barrier layers 4 which are alternately deposited so as to form seven quantum wells. In the multiple-quantum well structure 5, the atomic ordering is generated. The thickness of the InGaAsP strained well layer 3 is set to be in a range of 3 to 6 nm, while the thickness of the InGaAsP barrier layer 4 is set to be in a range of 5 to 20 nm. The photoluminescence (PL) emission wavelength of the multiple-quantum well structure 5 is 1.3 µm. In this example, a compression strain of 0.8% is introduced into the strained well layers 3 and the crystal growth temperature thereof is set to be 580 degrees, thereby generating the atomic ordering in the barrier layers 4. The energy band gaps of the multi-layered structure are shown in FIG. 7B.

As shown in FIG. 7B, a p-InGaAsP/p-InP/n-InP/p-InP current confining structure 7 with a thickness in a range of 3 to 6 µm is provided on both sides of the stripe-shaped multi-layered structure. A groove is provided in a part of the current confining structure 7. The surface of the groove is covered with an SiO$_2$ layer. A p-type electrode 8 is provided on the upper surface of the semiconductor laser device, while an n-type electrode 9 is provided on the bottom surface of the semiconductor laser device.

Figure 8A:
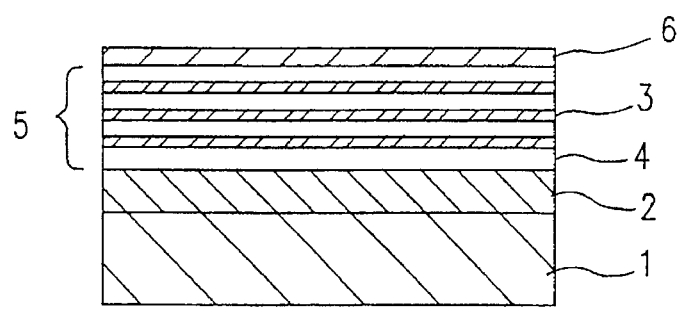
FIGS. 8A to 8D are cross-sectional views showing the respective process steps for fabricating the strained quantum well laser according to the second example of the present invention.
Figure 8B:
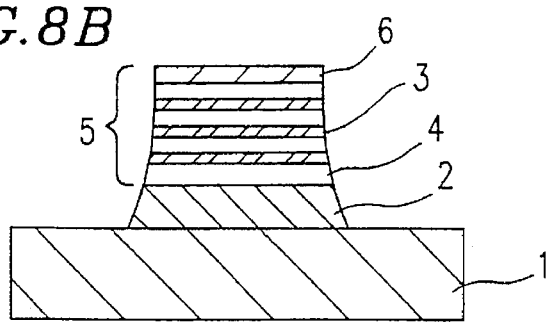

Next, referring to FIGS. 8A to 8D, a method for fabricating the strained quantum well laser device shown in FIG. 7A will be described. First, as shown in FIG. 8A, a first crystal growth process step for epitaxially growing an InGaAsP first optical waveguide layer 2; a multiple-quantum well structure 5 comprised of alternately stacked layers of an InGaAsP quantum well layer 3 and an InGaAsP current barrier layer 4; and an InGaAsP second optical waveguide layer 6 in this order on the InP substrate 1 is performed. Then, as shown in FIG. 8B, an etching process for etching these layers in a stripe shape is performed.

Figure 8C:
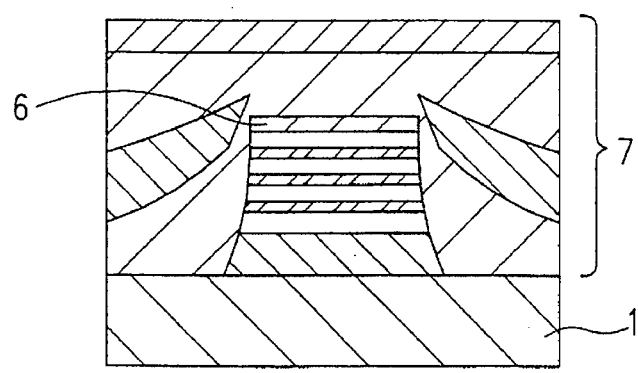
Figure 8D:
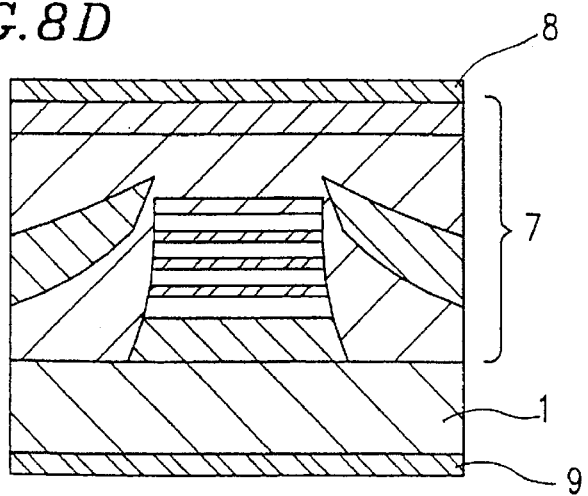

Thereafter, as shown in FIG. 8C, a second crystal growth process step for epitaxially growing the current confining structure 7 is performed. Finally, as shown in FIG. 8D, an electrode formation process step for forming the p-type electrode 8 and the n-type electrode 9 is performed.

In this example, in order to generate the atomic ordering, a strain of 0.8% is introduced into the well layers, and the crystal growth temperature is set to be 580° C., and the supply ratio of a Group V gas to a Group III gas is set to be 250. These crystal growth conditions are indicated at a point A in FIG. 5. As described above, the semiconductor laser device of this example includes in the stripe-shaped multi-layered structure a similar crystal to the strained quantum well crystal of the first example. In this example, such a strained quantum well crystal is also formed under the same conditions as those described in the first example.

The oscillation wavelength of the semiconductor laser device including a strained quantum well crystal having an atomic ordering is 1.3 µm, and the maximum optical output therefrom is 300 mW, which is at the same level as that of the semiconductor laser device having no atomic ordering. The laser oscillation is generated at a threshold current at a similar level.

Figure 9:
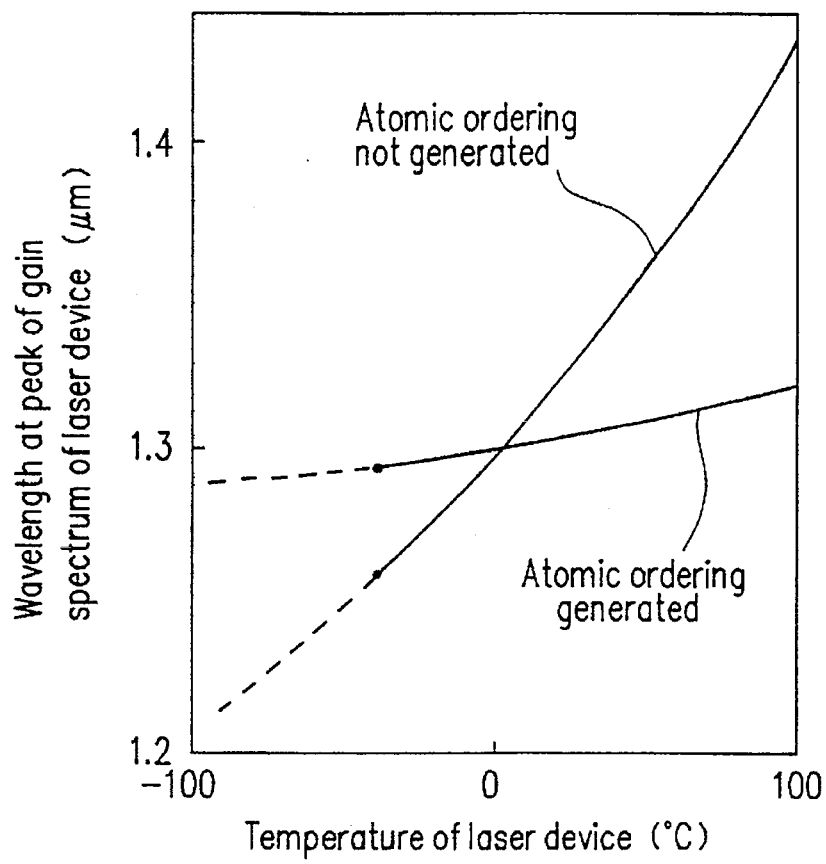
FIG. 9 is a graph illustrating a difference in a shift amount of the wavelength at a peak of the gain spectrum depending upon the generation of the atomic ordering.

FIG. 9 is a graph showing a temperature dependence of the laser oscillation wavelength. In the case where the temperature of the semiconductor laser device is varied from $-40°$ C. to $100°$ C., the oscillation wavelength of the strained quantum well type semiconductor laser device having no atomic ordering is varied from 1.26 µm to 1.44 µm, while the oscillation wavelength of the strained quantum well type semiconductor laser device having an atomic ordering is varied from 1.29 µm to 1.31 µm. That is to say, the generation of the atomic ordering reduces the variation amount of the wavelength to one fifth or less. Since the variation amount of the oscillation wavelength is reduced with respect to the temperature, it is possible to provide a semiconductor laser device stably oscillating in a temperature range of $-40°$ C. to $100°$ C. without performing any special control of the temperature of the semiconductor laser device.

Figure 10:
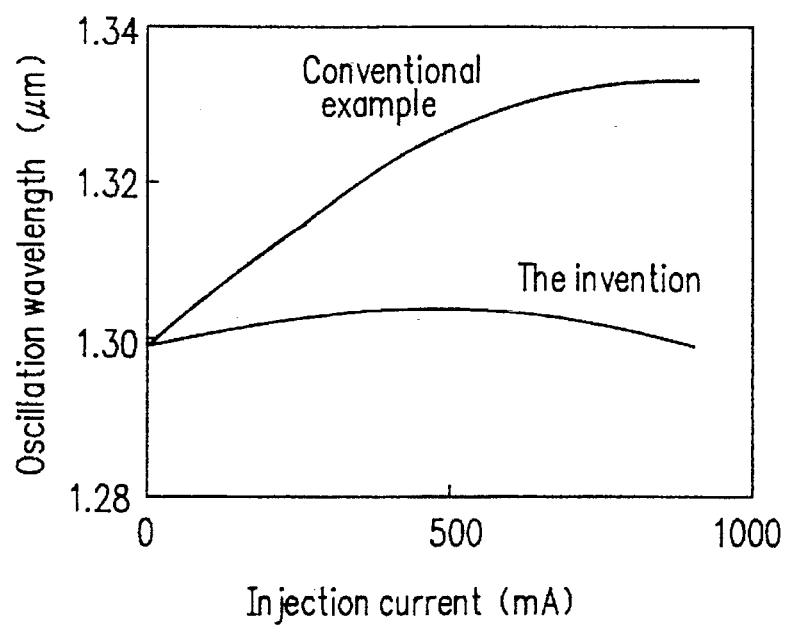
FIG. 10 is a graph showing the difference in the injection current dependence of the oscillation wavelength between the present invention and a conventional example.

FIG. 10 shows the injection current dependence of the oscillation wavelength. In general, as the amount of the current injected into the semiconductor laser device increases, a joule heat is generated because of the internal resistance of the semiconductor laser device, so that the temperature of the semiconductor laser device is increased. As a result, the oscillation wavelength is varied. However, in the semiconductor laser device of this example, since the temperature dependence of the oscillation wavelength is small, the variation in the amount of the injection current causes almost no variation in the oscillation wavelength. For a high-output semiconductor laser device to which a large amount of current is injected, in particular, a small variation in the oscillation wavelength is preferable. In addition, the oscillation wavelength at the time of a high output can be expected advantageously easily from the PL emission wavelength.

As is apparent from the foregoing description, it is possible to provide a semiconductor laser device where the oscillation wavelength is varied a little depending upon the temperature and the amount of the injection current in this example.

Example 3

Referring to FIGS. 11A and 11B, a still another exemplary strained quantum well semiconductor laser device according to the present invention will be described. FIG. 11A schematically shows a structure of a semiconductor laser device including an Sn-doped InP semiconductor single crystalline substrate 1 having a stripe-shaped ridge, and a stripe-shaped multi-layered structure provided on the ridge of the Sn-doped InP semiconductor single crystalline substrate 1. A diffraction grating 10 with a pitch of 180 nm is formed on the upper surface of the stripe-shaped ridge. The stripe-shaped multi-layered structure is obtained by epitaxially growing an InGaAsP ($\lambda g=1.05$ µm) first optical waveguide layer 2; a multiple-quantum well structure 5; and an InGaAsP ($\lambda g=1.05$ µm) second optical waveguide layer 6, in this order on the InP semiconductor single crystalline substrate 1. The multiple-quantum well structure 5 includes InGaAsP strained well layers 3 (compression strain of 0.8%) and InGaAsP barrier layers 4 ($\lambda g=1.15$ µm) which are alternately deposited so as to form seven quantum wells. In the multiple-quantum well structure 5, the atomic ordering is generated. The thickness of the respective semiconductor layers can be set to be in respective ranges described in the third example. The photoluminescence (PL) emission wavelength of the multiple-quantum well structure 5 is 1.3 µm. In this example, a compression strain of 0.8% is introduced into the strained well layers 3 and the crystal growth temperature is set to be 580 degrees, thereby generating the atomic ordering in the barrier layers 4. The energy band gaps of the multi-layered structure are shown in FIG. 11B.

As shown in FIG. 11B, a p-InGaAsP/p-InP/n-InP/p-InP current confining structure 7 is provided on both sides of the stripe-shaped multi-layered structure. A groove is provided in a part of the current confining structure 7. The surface of the groove is covered with an $SiO_2$ layer. A p-type electrode 8 is provided on the upper surface of the semiconductor laser device, while an n-type electrode 9 is provided on the bottom surface of the semiconductor laser device.

The semiconductor laser device of this example is characterized by oscillating at an oscillation wavelength determined by the pitch of the diffraction grating 10, and is called a "distributed feedback (DFB) type laser device".

The wavelength at the peak of the gain spectrum in the semiconductor laser device of this example is varied depending upon the temperature or the amount of the injection current in the same way as the semiconductor laser device of the second example.

Figure 12A:
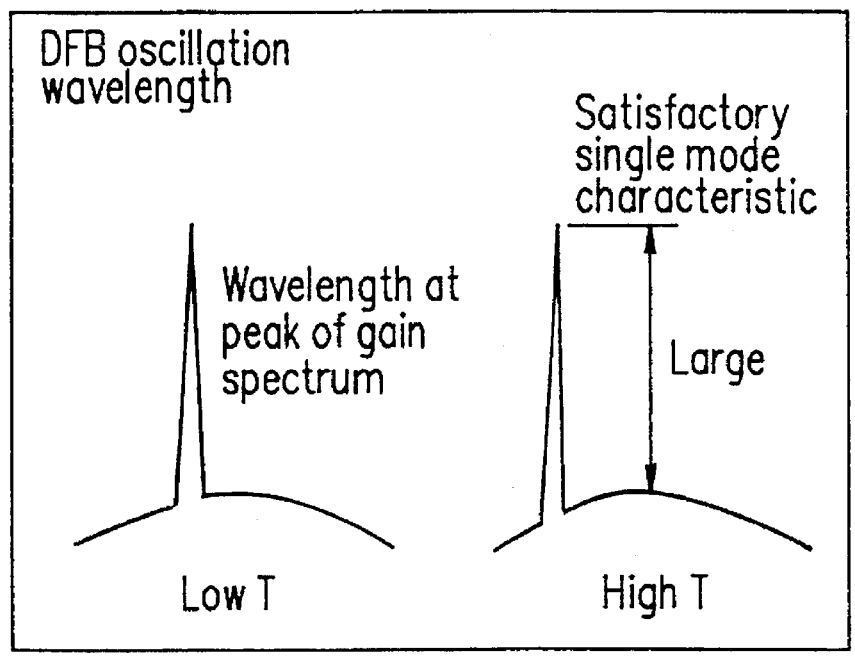
FIGS. 12A and 12B are graphs illustrating the difference in the emission spectra of the multiple-quantum well structure depending upon the introduction of the strain.
Figure 12B:
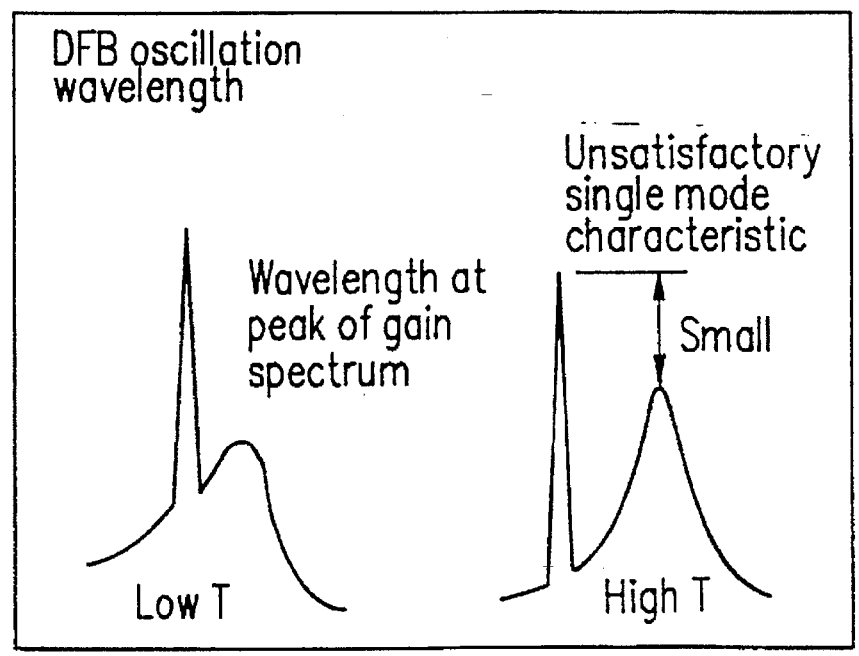
Figure 13:
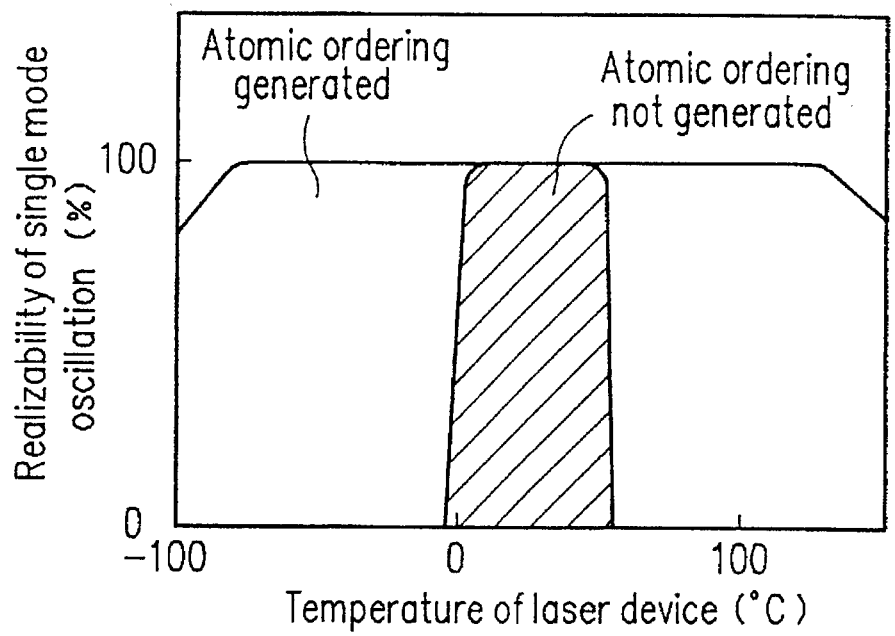
FIG. 13 is a graph illustrating the difference in the temperature dependence of the realizability of the single mode oscillation in accordance with the generation of the atomic ordering.

It is ideal for a DFB type laser device to oscillate in a single mode. However, as shown in FIG. 12B, in the case where the difference between the DFB oscillation wavelength determined by the pitch of the diffraction grating 10 and the wavelength at the peak of the gain spectrum is larger than 20 nm, the possibility of the single mode oscillation of the laser device is drastically reduced. FIG. 13 shows the temperature dependence of the realizability of the single mode characteristics. In the case where a semiconductor laser device having no atomic ordering is driven without performing any temperature control, the temperature at which the single mode oscillation is realized ranges from 0° C. to 40° C. On the other hand, in the case where a semiconductor laser device is modeled by using a strained quantum well crystal having an atomic ordering, the single mode oscillation can be maintained even if the temperature of the semiconductor laser device is varied in a range of −80° C. to 120° C. As a result, it is no longer necessary to use a Peltier device for controlling the temperature, so that the cost of a laser module can be considerably reduced.

Figure 14:
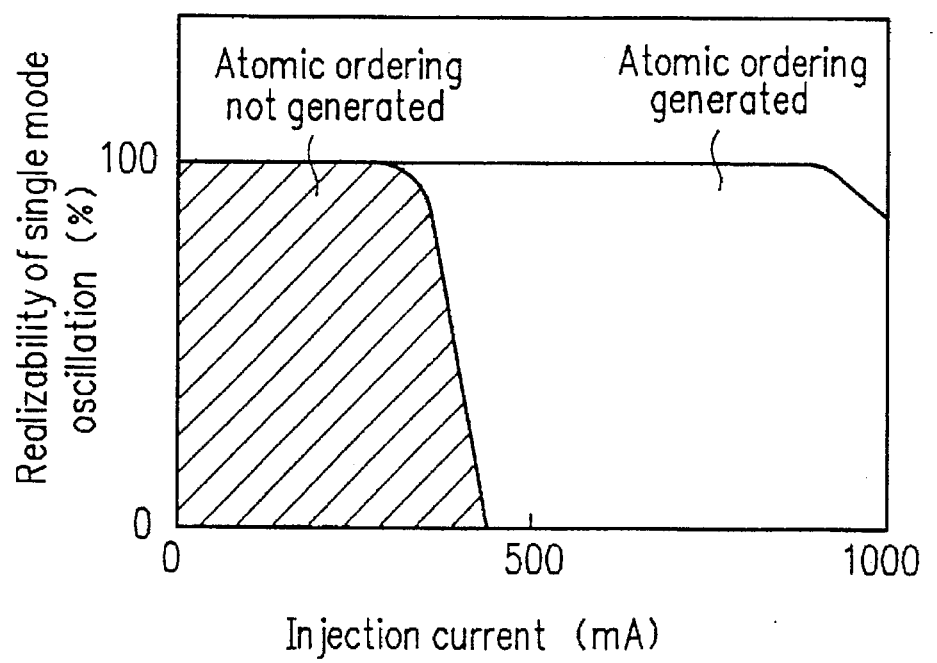
FIG. 14 is a graph illustrating the difference in the injection current dependence of the realizability of the single mode oscillation in accordance with the generation of the atomic ordering.
Figure 15A:
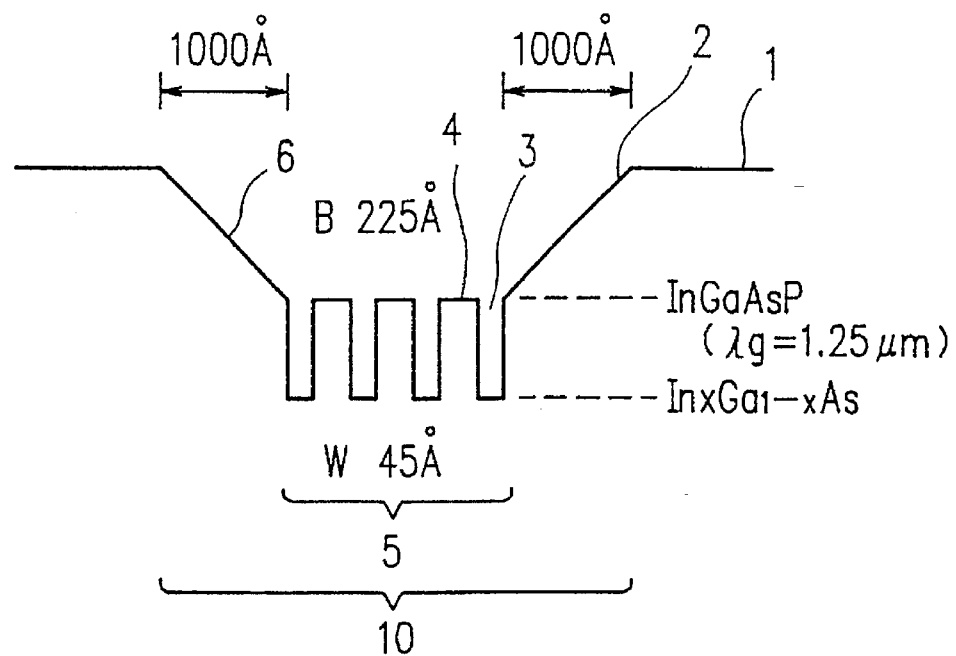
Figure 15B:
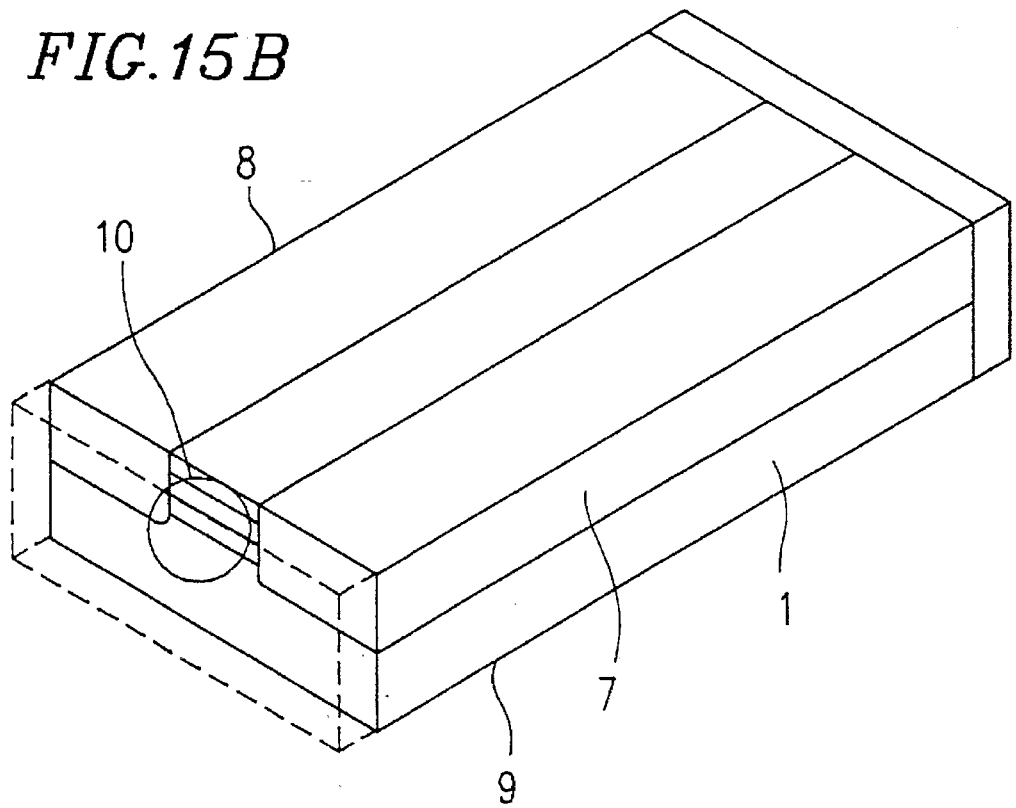
FIG. 15B is a perspective view showing a conventional strained quantum well type semiconductor laser device.

In addition, a high-output driving of a DFB type laser device is also realized. As shown in FIG. 14, in the case where the atomic ordering is not generated, the realizability of the single mode oscillation decreases if the amount of the injection current is 300 mA or more. On the other hand, in the case where the atomic ordering is generated, the single mode oscillation characteristics are maintained even when the amount of the injection current is 600 mA or more. As a result, the production yield of a high-output DFB type laser device oscillating in a single mode is high even when the optical output therefrom widely ranges from a low output to a high output.

As described above, in this example, it is possible to provide a DFB type laser device for realizing a single mode oscillation characteristic which is unlikely to be affected by the temperature or the amount of the injection current, and provide an inexpensive module for which a Peltier device is not required.

In the foregoing examples, the barrier layer 4 is composed of InGaAsP ($\lambda g=1.15$ µm). However, if the barrier layer 4 is composed of InGaAsP ($\lambda g=1.05$ µm), then an atomic ordering is more likely to be generated in the barrier layer. The present invention has been described as being applied to a semiconductor laser device having a spectrum confinement heterostructure. Alternatively, the present invention is applicable to other kinds of semiconductor laser devices. If an AlGaAs/GaAs based crystal, an InGaP/AlGaInP based crystal, a ZnSe based crystal, or a GaN based crystal is used instead of an InGaAsP/InP based crystal, the same effects can be attained.

The semiconductor laser device to which the present invention is applicable is not limited to a Fabry-Perot type laser device and a DFB type laser device, but the present invention is applicable to a semiconductor laser device having a high additional value such as a DBR type laser device. In addition, a strained quantum well crystal of the present invention is applicable not only to a light-emitting element such as a semiconductor laser device, but also to a photodetector and a high-speed electron device such as an HFET. In such cases, the temperature dependence of these devices can also be improved.

As is apparent from the foregoing description, according to the present invention it is possible to provide a semiconductor laser device where the oscillation wavelength is not affected by the ambient temperature and the injection current by generating an atomic ordering in a strained quantum well layer, and provide an inexpensive DFB type laser device for which a temperature control device such as a Peltier device is not required. Therefore, much practical effect can be attained by the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising: a strained quantum well structure including a well layer and a barrier layer, and a semiconductor substrate for supporting the strained quantum well structure, wherein the well layer and the barrier layer are composed of an InGaAsP mixed crystal having respectively different energy band gaps from each other, and wherein, in at least one of the well layer and the barrier layer, an atomic ordering is generated so that a lattice plane of a first compound and a lattice plane of a second compound are alternately stacked one by one to constitute the layer.

2. A semiconductor laser device according to claim 1, further comprising a first optical waveguide layer and a second optical waveguide layer so as to sandwich the strained quantum well structure therebetween.

3. A semiconductor laser device according to claim 1, wherein the semiconductor substrate is composed of InP.

4. A strained quantum well crystal comprising: a semiconductor crystal; and an InGaAsP crystal having a lattice constant different from a lattice constant of the semiconductor crystal, wherein an atomic ordering is generated in the InGaAsP crystal so that a lattice plane of a first compound and a lattice plane of a second compound are alternately stacked one by one to constitute the InGaAsP crystal.

* * * * *

UNITED STATES PATENT AND TRADEMARK OFFICE
CERTIFICATE OF CORRECTION

PATENT NO. : 5,652,762
DATED : July 29, 1997
INVENTOR(S) : Otsuka, et. al.

It is certified that error appears in the above-identified patent and that said Letters Patent is hereby corrected as shown below:

Title page, item [56], References Cited, Other Publications, in the "D.J. Arent et al. "delete "No. 12" and insert -- and insert --No. 15--.

Signed and Sealed this

Thirteenth Day of January, 1998

Attest:

Attesting Officer

BRUCE LEHMAN

Commissioner of Patents and Trademarks

UNITED STATES PATENT AND TRADEMARK OFFICE
CERTIFICATE OF CORRECTION

PATENT NO.  : 5,652,762

DATED       : July 29, 1997

INVENTOR(S) : Otsuka, et. al.

It is certified that error appears in the above-identified patent and that said Letters Patent is hereby corrected as shown below:

Title page, item [56], References Cited, Other Publications, in the "D. J. Arent et al." delete "No. 12" and insert --No. 15--.

This certificate supersedes Certificate of Correction issued January 13, 1998.

Signed and Sealed this

Twenty-first Day of April, 1998

*Attest:*

BRUCE LEHMAN

*Attesting Officer*  *Commissioner of Patents and Trademarks*